US008827429B2

(12) United States Patent
Koseki

(10) Patent No.: US 8,827,429 B2
(45) **Date of Patent: *Sep. 9, 2014**

(54) METHOD OF MANUFACTURING LIQUID JET HEAD, LIQUID JET HEAD, AND LIQUID JET APPARATUS

(75) Inventor: Osamu Koseki, Chiba (JP)

(73) Assignee: SII Printek Inc. (JP)

( * ) Notice: Subject to any disclaimer, the term of this patent is extended or adjusted under 35 U.S.C. 154(b) by 49 days.

This patent is subject to a terminal disclaimer.

(21) Appl. No.: 13/401,888

(22) Filed: Feb. 22, 2012

(65) Prior Publication Data

US 2012/0212548 A1 Aug. 23, 2012

(30) Foreign Application Priority Data

Feb. 23, 2011 (JP) ................................ 2011-037346

(51) Int. Cl.
*B41J 2/045* (2006.01)
*H01L 41/22* (2013.01)
*H04R 17/00* (2006.01)

(52) U.S. Cl.
USPC ........................................... 347/68; 29/25.35

(58) Field of Classification Search
None
See application file for complete search history.

(56) References Cited

U.S. PATENT DOCUMENTS 5,631,680 A 5/1997 Sugahara ........................ 347/69
5,983,471 A * 11/1999 Osawa ......................... 29/25.35
6,722,035 B1 4/2004 Yoshimura .................. 29/890.1

FOREIGN PATENT DOCUMENTS

JP 168094 6/2000
JP 2001 096743 4/2001

* cited by examiner

*Primary Examiner* — Matthew Luu
*Assistant Examiner* — Erica Lin
(74) *Attorney, Agent, or Firm* — Adams & Wilks

(57) ABSTRACT

In a method of manufacturing a liquid jet head, a piezoelectric substrate is bonded onto a first base. Ejection grooves for ejection channels and dummy grooves for dummy channels are alternately formed in parallel with one another. The ejection grooves and the dummy grooves have such a depth as to pierce the piezoelectric substrate and to reach the first base substrate. An electrode material is deposited on inner surfaces of the ejection grooves and the dummy grooves. A cover plate is bonded to the piezoelectric substrate so as to cover the ejection grooves and the dummy grooves. In a subsequent first base substrate removing step, a part of the first base substrate on a side opposite to the cover plate and the electrode material deposited on bottom surfaces of the dummy grooves are removed. A second base substrate is then bonded to the first base substrate.

15 Claims, 6 Drawing Sheets

METHOD OF MANUFACTURING LIQUID JET HEAD, LIQUID JET HEAD, AND LIQUID JET APPARATUS

BACKGROUND OF THE INVENTION

1. Field of the Invention

The present invention relates to a method of manufacturing a liquid jet head which ejects liquid droplets for recording on a recording medium, and more particularly, to a method of manufacturing a liquid jet head in which ejection channels and dummy channels are alternately arranged in parallel with one another, a liquid jet head, and a liquid jet apparatus.

2. Description of the Related Art

In recent years, there has been used an ink jet type liquid jet head which ejects ink droplets onto recording paper and the like to draw letters and diagrams, or ejects a liquid material onto a surface of an element substrate to form a functional thin film. The liquid jet head of this type is supplied with ink or a liquid material from a liquid tank via a supply tube, and is caused to eject the ink or the liquid material filled in channels thereof from nozzles communicated to the channels. At the time of ink ejection, the liquid jet head and a recording medium for recording the jetted liquid are moved, to thereby record the letters and diagrams or form the functional thin film in a predetermined shape. As a liquid jet head of this kind, a liquid jet head of a share mode type is known. In such a liquid jet head of the share mode type, ejection channels and dummy channels are alternately formed in a surface of a piezoelectric substrate, and, by instantaneously deforming a partition wall between an ejection channel and a dummy channels, a liquid droplet is caused to be ejected from the ejection channel.

FIG. 8 illustrates a cross-sectional structure of an ink jet head described in Japanese Patent Application Laid-open No. 2000-168094. An ink jet head 100 includes a bottom wall 124 having ejection channels 112 and dummy channels 111 alternately formed therein and a top wall 110 disposed on an upper surface of the bottom wall 124. A piezoelectric side wall 103 is formed between an ejection channel 112 and a dummy channel 111. The piezoelectric side wall 103 includes an upper wall portion 125 which is an upper half thereof and a lower wall portion 126 which is a lower half thereof. The upper wall portion 125 is polarized in an upward direction while the lower wall portion 126 is polarized in a downward direction. Electrodes 105 are formed on wall surfaces of the respective piezoelectric side walls 103. Electrodes 1053 which are electrically connected to each other are formed on surfaces of the piezoelectric side walls 103 forming an ejection channel 112, while electrodes 105A which are electrically separated from each other are formed on surfaces of the piezoelectric side walls 103 forming a dummy channel 111. A nozzle plate (not shown) is disposed on a front surface of the ink jet head 100, and nozzles 116 for communicating with the ejection channels 112, respectively, are formed in the nozzle plate.

The ink jet head 100 is driven as follows. Voltage is applied between electrodes 105B disposed in an ejection channel 112 and electrodes 105A formed on side surfaces on the ejection channel 112 side of two dummy channels 111 positioned on both sides of the ejection channel 112. Then, piezoelectric thickness shear deformation is caused in the piezoelectric side walls 103 in directions of increasing the capacity of the ejection channel 112. After a predetermined length of time passes, the application of the voltage is stopped, the capacity of the ejection channel 112 changes from the increased state to a natural state, pressure is applied to ink in the ejection channel 112, and an ink droplet is ejected from the nozzle 116.

The ink jet head 100 is manufactured as follows. First, a piezoelectric ceramic layer which is polarized in the upward direction is adhered to another piezoelectric ceramic layer which is polarized in the downward direction to form an actuator substrate 102. Then, grooves in parallel with one another are formed in the actuator substrate 102 by cutting with a diamond cutter or the like to form the piezoelectric side walls 103 including the upper wall portions 125 and the lower wall portions 126. The electrodes 105A and 105B are formed by vacuum deposition or the like on side surfaces of the piezoelectric side walls 103 formed in this way. However, it is necessary to electrically separate the electrodes 105A on the piezoelectric side walls 103 of a dummy channel 111 for the purpose of being able to independently drive adjacent ejection channels 112. Therefore, using a laser or a diamond cutter from an opening side of the piezoelectric side wall 103, a separating groove 118 is formed in the electrode formed on a bottom surface of a dummy channel 111 to electrically separate the electrodes 105A on the right side wall and the left side wall.

However, it takes a great time to apply a laser beam into each of the dummy channels 111 or to insert a diamond cutter which is thinner than the width of the dummy channels 111 into each of the dummy channels 111 to cut the electrodes in forming the separating grooves 118. Further, as the pitch of the ejection channels 112 decreases and the dummy channels 111 become narrower, alignment of the laser beam or the diamond cutter becomes quite difficult. Still further, problems become obvious including that a laser beam does not reach the bottom surface of a dummy channel 111, that a laser beam is also applied to an upper surface of a piezoelectric side wall 103, and that the required thickness of the diamond cutter is too small to manufacture.

SUMMARY OF THE INVENTION

The present invention has been made in view of the above-mentioned problems, and an object of the present invention is to provide a method of manufacturing a liquid jet head in which electrodes formed on the bottom surfaces of the dummy channels 111 are collectively removed without using a laser beam or a diamond cutter.

A method of manufacturing a liquid jet head according to the present invention includes: a stacked substrate forming step of bonding a piezoelectric substrate onto a first base substrate to form a stacked substrate; a groove forming step of alternately forming ejection grooves for ejection channels and dummy grooves for dummy channels in parallel with one another, the ejection grooves and the dummy grooves having a depth to pierce the piezoelectric substrate and to reach the first base substrate; an electrode material depositing step of depositing an electrode material on inner surfaces of the ejection grooves and the dummy grooves; a cover plate bonding step of bonding a cover plate to the piezoelectric substrate so as to cover the ejection grooves and the dummy grooves; a first base substrate removing step of removing a part of the first base substrate on a side opposite to the cover plate and removing the electrode material deposited on bottom surfaces of the dummy grooves; and a second base substrate bonding step of bonding a second base substrate to the first base substrate.

Further, in the groove forming step, at least one ends of the ejection grooves are formed to points which are inside an outer periphery of the piezoelectric substrate, and the dummy grooves are formed to the outer periphery of the piezoelectric substrate.

Further, the method further includes: after the stacked substrate forming step, a resin film pattern forming step of forming a pattern of a resin film on a surface of the piezoelectric substrate; and, after the electrode material depositing step, a resin film peeling step of removing the resin film and forming drive electrodes on side surfaces of the ejection grooves and the dummy grooves and forming extraction electrodes on the surface of the piezoelectric substrate.

Further, in the groove forming step, the dummy grooves are formed so as to be deeper than the ejection grooves, and in the first base substrate removing step, a part of the first base substrate is left under the ejection grooves.

Further, the first base substrate includes a piezoelectric material, and the second base substrate includes a low dielectric constant material having a dielectric constant that is lower than a dielectric constant of the piezoelectric material.

A liquid jet head according to the present invention includes: a stacked substrate including a first base substrate and a piezoelectric substrate bonded thereon with an adhesive, the stacked substrate having ejection grooves for ejection channels and dummy grooves for dummy channels alternately formed therein in parallel with one another, the ejection grooves having a depth to pierce the piezoelectric substrate and to reach the first base substrate and the dummy grooves piercing the piezoelectric substrate and the first base substrate; a second base substrate bonded to a lower surface of the stacked substrate to close the dummy grooves; a cover plate bonded to an upper surface of the piezoelectric substrate so as to cover the ejection grooves and the dummy grooves; first drive electrodes which are formed on both side surfaces of the respective ejection grooves and which are electrically connected to each other; and second drive electrodes which are formed on both side surfaces of the respective dummy grooves and which are electrically separated from each other by removing a part of the first base substrate.

Further, the first base substrate includes a piezoelectric material, the piezoelectric substrate is polarized in a direction perpendicular to a surface thereof, and the first base substrate is polarized in a direction opposite to the direction of polarization of the piezoelectric substrate.

Further, the first base substrate includes a piezoelectric material, and the second base substrate includes a low dielectric constant material having a dielectric constant that is lower than a dielectric constant of the piezoelectric material.

Further, the ejection grooves are formed from one end to points before another end of the stacked substrate, and the dummy grooves are formed from the one end to the another end.

A liquid jet apparatus according to the present invention includes: anyone of the liquid jet heads described above; a moving mechanism for reciprocating the liquid jet head; a liquid supply tube for supplying liquid to the liquid jet head; and a liquid tank for supplying the liquid to the liquid supply tube.

According to an aspect of the present invention, a method of manufacturing a liquid jet head includes a stacked substrate forming step of bonding a piezoelectric substrate onto a first base substrate to form a stacked substrate, a groove forming step of alternately forming ejection grooves for ejection channels and dummy grooves for dummy channels in parallel with one another, the ejection grooves and the dummy grooves having a depth to pierce the piezoelectric substrate and to reach the first base substrate, an electrode material depositing step of depositing an electrode material on inner surfaces of the ejection grooves and the dummy grooves, a cover plate bonding step of bonding a cover plate to the piezoelectric substrate so as to cover the ejection grooves and the dummy grooves, a first base substrate removing step of removing a part of the first base substrate on a side opposite to the cover plate and removing the electrode material deposited on bottom surfaces of the dummy grooves, and a second base substrate bonding step of bonding a second base substrate to the first base substrate.

This may eliminate the necessity of alignment with high precision of a laser beam or a diamond cutter in order to electrically separate the electrode material deposited on the bottom surfaces of the dummy grooves. Further, even when the pitch of the ejection channels and the dummy channels decreases and the ejector channels and the dummy channels become narrower, the electrodes may be separated. Still further, electrodes of a lot of dummy channels may be collectively separated, and thus, manufacturing time may be reduced.

DETAILED DESCRIPTION OF THE PREFERRED EMBODIMENTS

Figure 1:
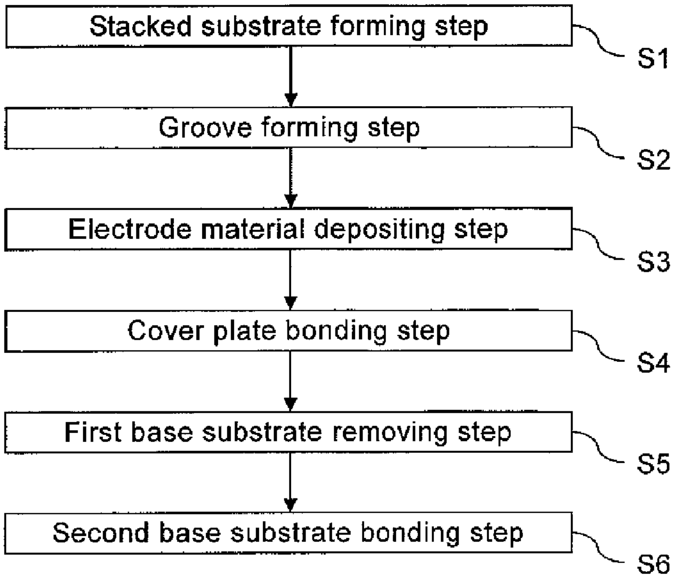
FIG. 1 is a process flow chart illustrating a basic method of manufacturing a liquid jet head according to the present invention.

FIG. 1 is a process flow chart illustrating a basic method of manufacturing a liquid jet head according to the present invention. First, in a stacked substrate forming step S1, a piezoelectric substrate is bonded onto a first base substrate. As the piezoelectric substrate, a ceramic substrate formed of lead zirconate titanate (PZT) or $BaTiO_3$ may be used. As the first base substrate, a piezoelectric material such as PZT ceramic may be used. Further, as the first base substrate, a nonpiezoelectric material may also be used. The piezoelectric substrate and the first base substrate are bonded to each other with an adhesive. The piezoelectric substrate undergoes in advance polarization treatment in a direction of the normal to a surface of the substrate. When a piezoelectric material is used as the first base substrate, the first base substrate undergoes in advance polarization treatment in a direction opposite to the direction of polarization of the piezoelectric substrate.

Next, in a groove forming step S2, ejection grooves for forming channels which are for ejecting liquid and dummy grooves for forming dummy channels which do not eject liquid are alternately formed in parallel with one another. In this case, the ejection grooves and the dummy grooves are formed to depths to pierce the piezoelectric substrate and to reach the first base substrate. In the case of forming ejection channels of a chevron type in which piezoelectric materials having directions of polarization that are opposite to each other are stacked, a piezoelectric material such as PZT ceramic is used as the first base substrate and the ejection grooves are formed so that the border between the piezoelectric substrate and the first base substrate is about half the depth of the ejection channels. Note that, in the case of using a nonpiezoelectric material as the first base substrate, also, the ejection grooves are formed so that the border between the piezoelectric substrate and the first base substrate is about half the depth of the ejection channels. The dummy grooves are formed so as to have a depth which is nearly equal to or larger than the depth of the ejection grooves. At least one ends of the ejection grooves are formed to points which are inside the outer periphery of the piezoelectric substrate, and the dummy grooves may be formed straight from one end to the other end of the piezoelectric substrate, that is, to the outer periphery of the stacked substrate. The grooves may be formed using a dicing blade.

Then, in an electrode material depositing step S3, an electrode material is deposited on a surface of the piezoelectric substrate which is opposite to the first base substrate side (hereinafter, referred to as an upper surface of the piezoelectric substrate) and on inner surfaces of the ejection grooves and the dummy grooves. A metal material may be deposited by sputtering or vapor deposition. Plating may also be used to deposit a metal material. Next, in a cover plate bonding step S4, a cover plate is bonded to the upper surface of the piezoelectric substrate so as to cover the ejection grooves and the dummy grooves. As the cover plate, the material of the piezoelectric substrate may be used. By using, as the material of the cover plate, the material of the piezoelectric substrate thereunder, the thermal expansion coefficient may be caused to be the same, and thus, warpage and a crack due to temperature change may be suppressed. Further, as the cover plate, the material of a second base substrate to be described later may be used. This causes the piezoelectric material to be sandwiched between substrates which are formed of a same material, and thus, in this case, also, warpage of the substrate due to difference in thermal expansion coefficient may be prevented.

Next, in a first base substrate removing step S5, a part of the first base substrate which is opposite to the side on which the cover plate is bonded is removed and the electrode material deposited on the bottom surfaces of the dummy grooves is removed. This may electrically divide the electrode material deposited on both side surfaces of a dummy groove. The removing of a part of the first base substrate may be carried out by grinding using a grinder or a flat surface grinding machine and/or by abrasion using abrasive grains from a lower surface side of the first base substrate which is opposite to the cover plate side. As a result, the electrode material may be electrically divided collectively over a plurality of the dummy grooves. In other words, alignment with high precision is not necessary to remove the electrode material. Further, even when the dummy channels are formed so as to have a smaller groove width as the pitch of the ejection channels and the dummy channels decreases and the ejection channels and the dummy channels become narrower, the electrode material deposited on the bottom surfaces of the dummy grooves may be easily removed. Still further, the cover plate is bonded to the upper surface of the piezoelectric substrate, and thus, even when the bottom surfaces of the dummy grooves are opened, a partition wall or an ejection groove between adjacent dummy grooves does not fall down. Note that, the ejection grooves may be formed so as to be deep in advance so that bottom surfaces of both the dummy grooves and the ejection grooves are opened. However, by leaving and not removing portions under the bottom surfaces of the ejection grooves, the partition walls between grooves become less likely to be broken when a part of the first base substrate is removed, which results in excellent workability.

Next, in a second base substrate bonding step S6, a second base substrate is bonded to the first base substrate to close the openings of the dummy grooves. As the second base substrate, the material of the first base substrate may be used. For example, when PZT ceramic is used as the first base substrate, the same PZT ceramic may be used as the second base substrate. By using the same material, the thermal expansion coefficient is the same, and thus, warpage and a crack due to temperature change may be suppressed. Further, as the second base substrate, a low dielectric constant material having a dielectric constant that is lower than a dielectric constant of the piezoelectric material may also be used. This may reduce change in ejection characteristics due to leakage of a drive signal to an adjacent partition wall caused by capacitive coupling between adjacent channels.

This may eliminate the necessity of alignment with high precision in order to remove the electrode material deposited on the bottom surfaces of the dummy grooves, may accommodate decreased pitch and smaller width of the ejection channels and the dummy channels, and may reduce the manufacturing time. The present invention is now described in detail in the following with reference to the attached drawings.

First Embodiment

Figure 2:
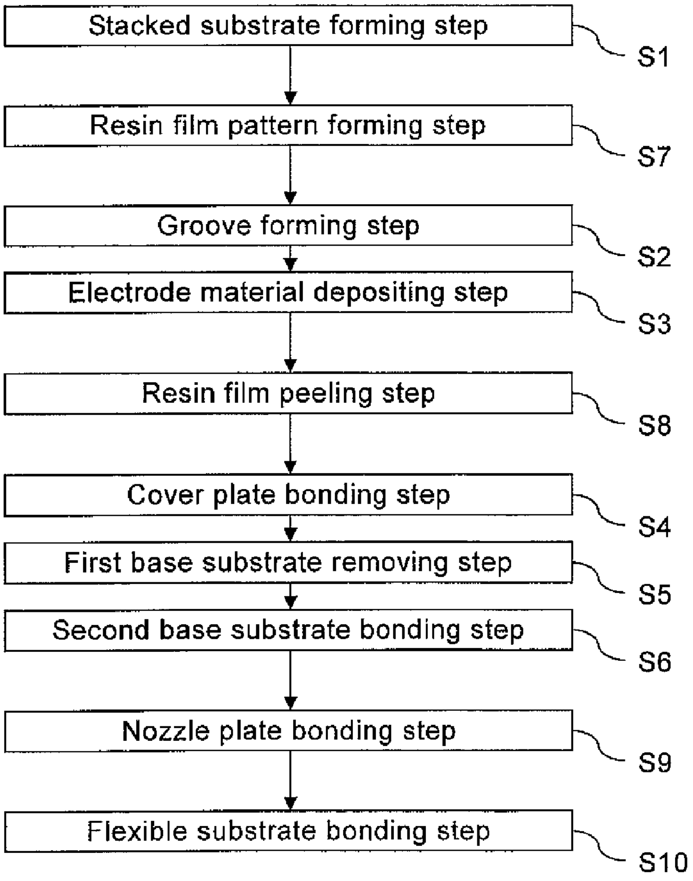
FIG. 2 is a process flow chart illustrating a method of manufacturing a liquid jet head according to a first embodiment of the present invention.

FIG. 2 is a process flow chart illustrating a method of manufacturing a liquid jet head according to a first embodiment of the present invention. This embodiment is a method of manufacturing a liquid jet head of a chevron type. FIG. 2 is different from FIG. 1 in that a resin film pattern forming step S7 is inserted before the groove forming step S2 and a resin film peeling step S8 is inserted after the electrode material depositing step S3. This is because the electrodes are formed by lift-off. Further, a nozzle plate bonding step S9 and a flexible substrate bonding step S10 are included after the second base substrate bonding step S6. Specific description is made in the following with reference to FIGS. 3, 4, and 5.

Figure 3A:
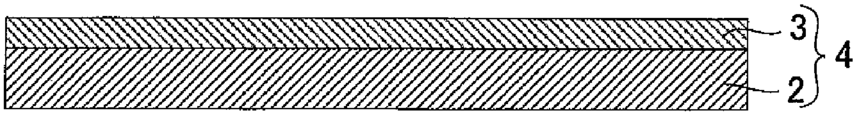
FIGS. 3A-3F are explanatory diagrams for illustrating the method of manufacturing a liquid jet head according to the first embodiment of the present invention.

FIGS. 3A to 5D are explanatory diagrams for illustrating the method of manufacturing a liquid jet head according to the first embodiment of the present invention. FIG. 3A is a schematic sectional view of a stacked substrate 4 after the stacked substrate forming step S1. A piezoelectric substrate 3 is bonded onto a first base substrate 2 with an adhesive. As the piezoelectric substrate 3, a PZT ceramic substrate is used. As the first base substrate 2, a PZT ceramic substrate which is the same as the piezoelectric substrate 3 is used. The piezoelectric substrate 3 and the first base substrate 2 undergo in advance polarization treatment in directions perpendicular to surfaces of the substrates which are opposite to each other, respectively.

Figure 3B:
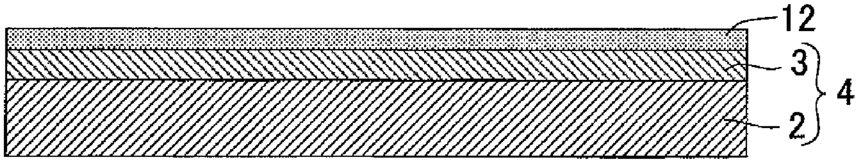

FIG. 3B is a schematic sectional view of the stacked substrate 4 after the resin film pattern forming step S7. After the stacked substrate forming step S1, a photosensitive resin film which is a dry film is formed on an upper surface of the stacked substrate 4. Then, through an exposing step and a developing step, the photosensitive resin film is selectively removed to form a pattern of a resin film 12. The pattern of the resin film 12 is provided for the purpose of forming by lift-off an electrode pattern for extraction electrodes and the like on an upper surface of the piezoelectric substrate 3. The resin film 12 is removed from regions in which electrodes are to be formed, while the resin film 12 is left in regions in which electrodes are not to be formed.

Figure 3C:
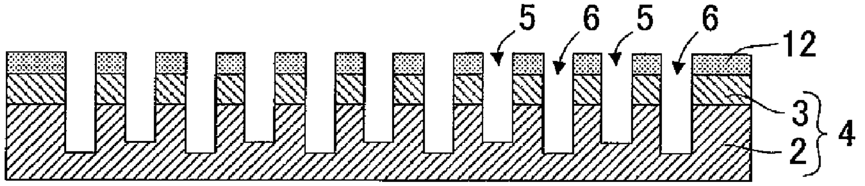
Figure 3D:
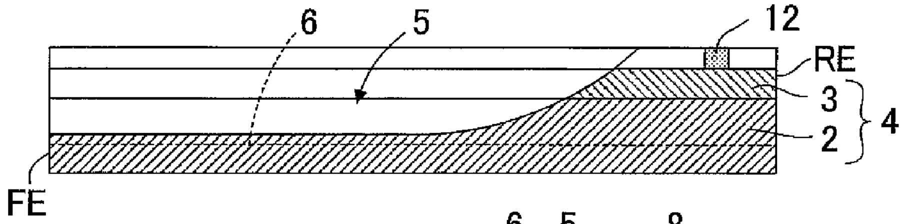

FIGS. 3C and 3D are schematic sectional views of the stacked substrate 4 after the groove forming step S2. FIG. 3C is a schematic sectional view taken along a line orthogonal to the grooves while FIG. 3D is a schematic sectional view taken along a line in the direction of ejection grooves 5. As illustrated in FIG. 3C, the ejection grooves 5 for forming the ejection channels and dummy grooves 6 for forming the dummy channels are alternately formed in parallel with one another. The ejection grooves 5 are formed to pierce the piezoelectric substrate 3 so that the depth of the first base substrate 2 is nearly equal to the thickness of the piezoelectric substrate 3. The dummy grooves 6 are formed so as to be deeper than the ejection grooves 5. Here, the width of the ejection grooves 5 and the width of the dummy grooves 6 are 20 μm to 50 μm, the thickness of the piezoelectric substrate 3 is 100 μm to 200 μm, and the thickness of the first base substrate 2 is 500 μm to 800 μm.

As illustrated in FIG. 3D, the ejection grooves 5 are formed from a front end FE to points before a rear end RE of the stacked substrate 4. The dummy grooves 6 are formed straight from the front end FE to the rear end RE of the stacked substrate 4. Rear end portions of the ejection grooves 5 are in the shape of the contour of the dicing blade which cuts the grooves.

Figure 3E:
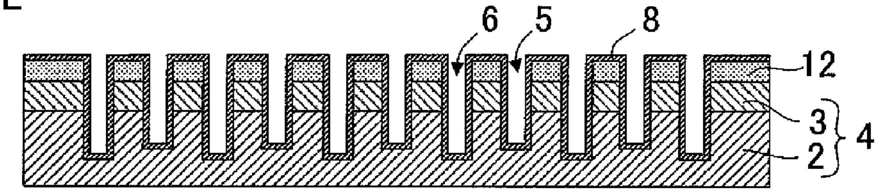
Figure 3F:
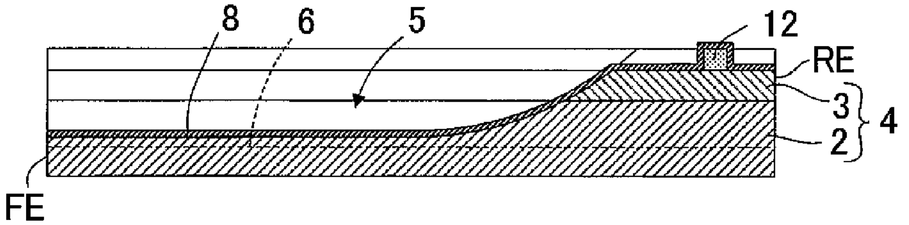

FIGS. 3E and 3F are schematic sectional views of the stacked substrate 4 after the electrode material depositing step S3. FIG. 3E is a schematic sectional view taken along a line orthogonal to the grooves while FIG. 3F is a schematic sectional view taken along a line in the direction of the ejection grooves 5. An electrode material 8 is deposited from above the stacked substrate 4 by, for example, sputtering. As the electrode material 8, a metal material such as aluminum, chromium, nickel, or titanium or a semiconductor material may be used. The electrode material 8 may be deposited by, other than sputtering, vapor deposition or plating. As illustrated in FIG. 3E, the electrode material 8 is deposited on side surfaces and bottom surfaces of the ejection grooves 5 and the dummy grooves 6.

Figure 4A:
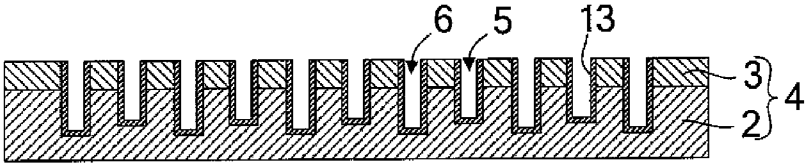
FIGS. 4A-4F are explanatory diagrams for illustrating the method of manufacturing a liquid jet head according to the first embodiment of the present invention.
Figure 4B:
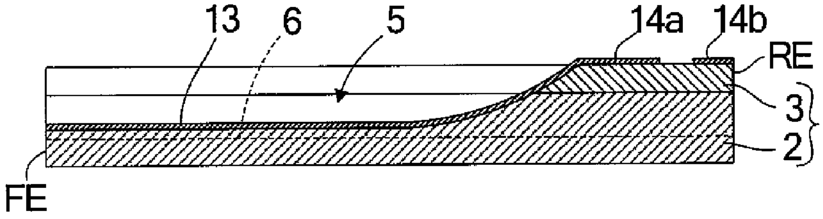
Figure 4C:
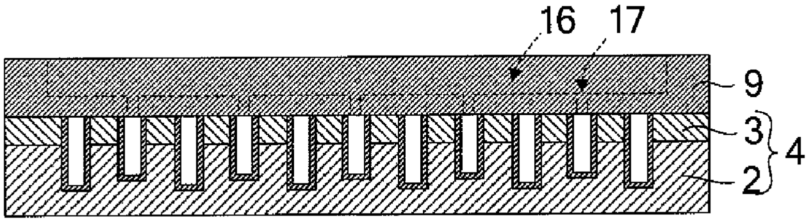
Figure 4D:
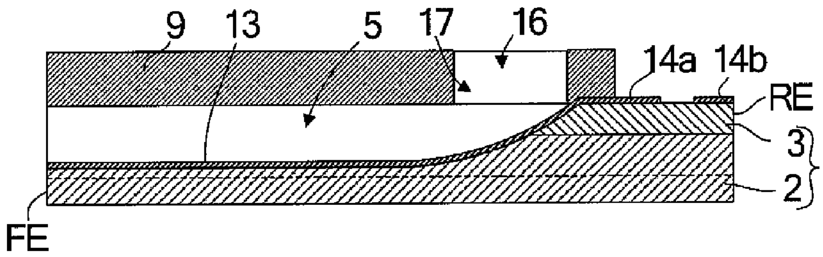
Figure 4E:
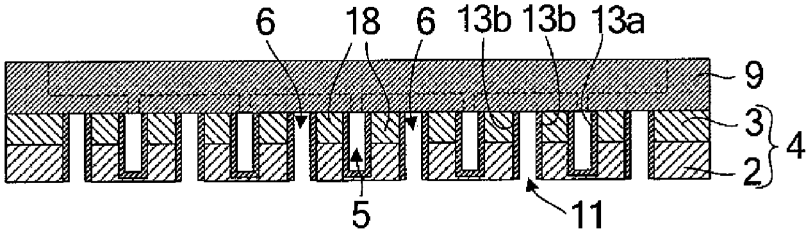
Figure 4F:
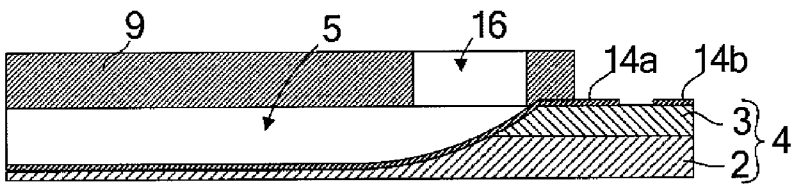

FIGS. 4A and 4F are schematic sectional views of the stacked substrate 4 after the resin film peeling step S8. FIG. 4A is a schematic sectional view taken along a line orthogonal to the grooves while FIG. 4B is a schematic sectional view taken along a line in the direction of the ejection grooves 5. By peeling the resin film 12 from the upper surface of the stacked substrate 4, the electrode material 8 deposited thereon is also peeled. This forms drive electrodes 13 on the side surfaces of the ejection grooves 5 and the dummy grooves 6 and forms extraction electrodes 14*a* and 14*b* on the surface of the stacked substrate 4 on the rear end RE side. The extraction electrodes 14*a* extend from the rear end portions of the ejection grooves 5 to points before the rear end RE, respectively, and are electrically connected to the drive electrodes 13 formed on the side surfaces of the ejection grooves 5, respectively. The extraction electrodes 14*b* are disposed on the surface of the stacked substrate 4 between the rear end RE and the extraction electrodes 14*a* and each of the extraction electrodes 14*b* electrically connects two drive electrodes 13 of dummy grooves 6 sandwiching an ejection groove 5 in which the two drive electrodes 13 are formed on side surfaces on the side of the ejection groove 5.

FIGS. 4C and 4D are schematic sectional views of the stacked substrate 4 after the cover plate bonding step S4. FIG. 4C is a schematic sectional view taken along a line orthogonal to the grooves while FIG. 40 is a schematic sectional view taken along a line in the direction of the ejection grooves 5. A cover plate 9 is bonded to the upper surface of the stacked substrate 4 with an adhesive so as to cover the ejection grooves 5 and the dummy grooves 6. The cover plate 9 includes a liquid supply chamber 16 and slits 17 which communicate with the liquid supply chamber 16. The ejection grooves 5 communicate with the liquid supply chamber 16 via the slits 17, respectively. The dummy grooves 6 do not communicate with the liquid supply chamber 16. Therefore, liquid supplied to the liquid supply chamber 16 is supplied to the ejection grooves 5.

FIGS. 4E and 4F are schematic sectional views of the stacked substrate 4 after the first base substrate removing step S5. FIG. 4E is a schematic sectional view taken along a line orthogonal to the grooves while FIG. 4F is a schematic sectional view taken along a line in the direction of the ejection grooves 5. A part of the first base substrate 2 which is opposite to the side on which the cover plate 9 is bonded is removed to open the bottom surfaces of the plurality of dummy grooves 6 (openings 11), thereby collectively removing the electrode material 8 deposited on the bottom surfaces of the dummy grooves 6 (or drive electrodes 13*b* deposited on the bottom surfaces). In this case, the bottom surfaces of the ejection grooves 5 are not opened and the first base substrate 2 is left thereunder (drive electrodes 13*a* of both side surfaces of an ejection groove 5 are electrically connected to each other). This may electrically separate drive electrodes 13*b* formed on both side surfaces of the respective dummy grooves 6 at the same time. Further, a partition wall 18 between an ejection groove 5 and a dummy groove 6 is bonded to a bottom surface of the cover plate 9, and thus, when a part of the first base substrate 2 is removed to open the bottom surfaces of the dummy grooves 6, the partition wall 18 does not fall down. Further, the first base substrate 2 is left under the bottom surfaces of the ejection grooves 5, and thus, the ejection grooves 5 may be prevented from being broken when the first base substrate 2 is removed. Note that, the first base substrate 2 may be ground using a grinder or a flat surface abrasion machine and/or may be abraded using abrasive grains to remove a part thereof.

Figure 5A:
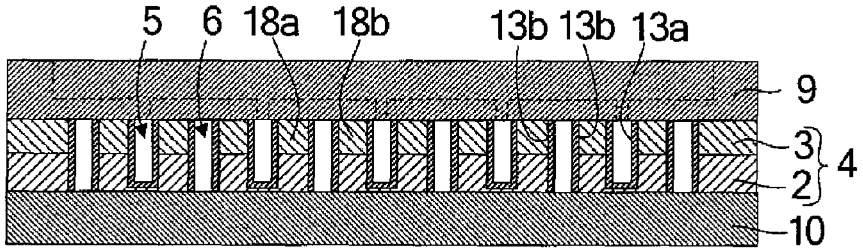
FIGS. 5A-5D are explanatory diagrams for illustrating the method of manufacturing a liquid jet head according to the first embodiment of the present invention.
Figure 5B:
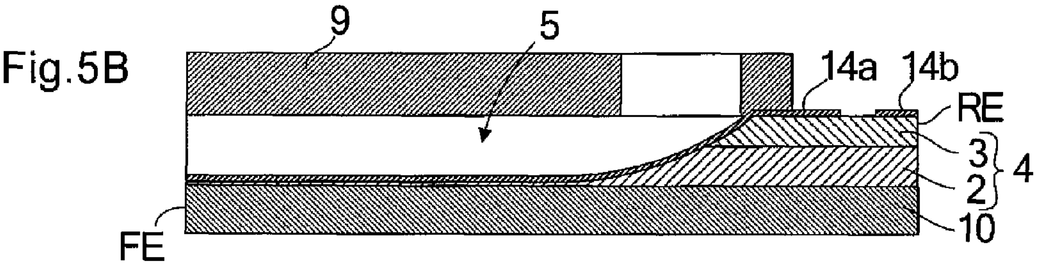

FIGS. 5A and 5B are schematic sectional views of the stacked substrate 4 after the second base substrate bonding step S6. FIG. 5A is a schematic sectional view taken along a line orthogonal to the grooves while FIG. 5B is a schematic sectional view taken along a line in the direction of the ejection grooves 5. A second base substrate 10 is bonded to the first base substrate 2 to close the openings 11 of the dummy grooves 6 (see FIG. 4E). As the second base substrate 10, a piezoelectric material, or a low dielectric constant material formed of an oxide or a nitride having a dielectric constant that is lower than a dielectric constant of the piezoelectric material may be used. By using such a low dielectric constant material, capacitive coupling between adjacent ejection grooves 5 may be suppressed. This may prevent a drive signal for driving an adjacent partition wall 18*a* from leaking via the second base substrate 10 to a partition wall 18*b* to reduce change in ejection characteristics due to a leaked signal.

Figure 5C:
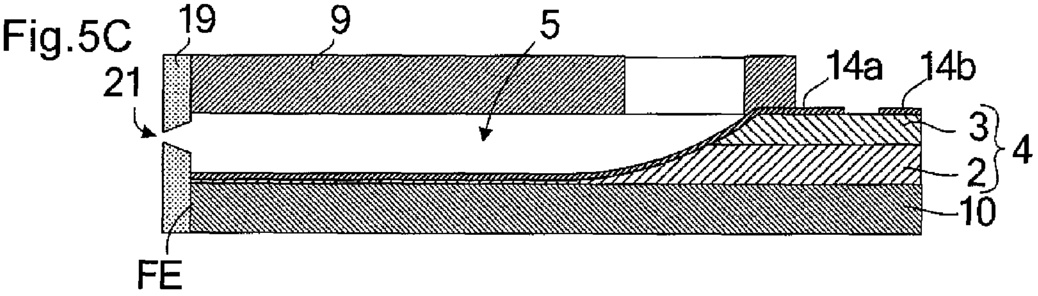

FIG. 5C is a schematic sectional view of the stacked substrate 4 after the nozzle plate bonding step S9, and illustrates a section taken along a line in the direction of the ejection grooves 5. A nozzle plate 19 is bonded to an end face at the front end FE of a stacked structure including the second base substrate 10, the stacked substrate 4, and the cover plate 9.

Nozzles 21 are formed in the nozzle plate 19. The nozzles 21 are formed at locations corresponding to the ejection grooves 5 and communicate with the ejection grooves 5, respectively.

Figure 5D:
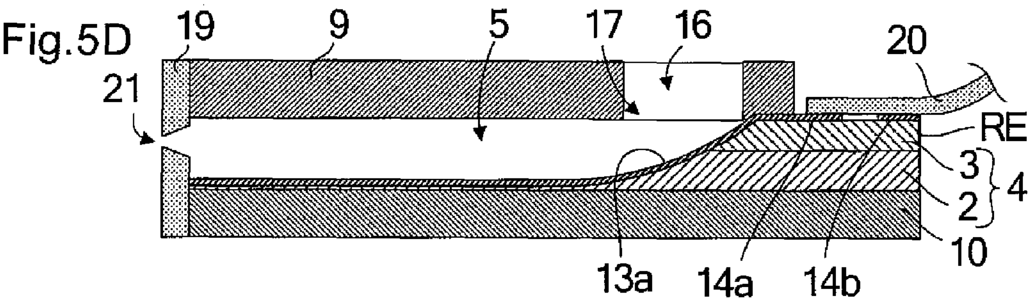

FIG. 5D is a schematic sectional view of the stacked substrate 4 after the flexible substrate bonding step S10. A flexible substrate 20 having wiring electrode (not shown) formed thereon is bonded to the surface in proximity to the rear end RE with a conductive material to electrically connect the extraction electrodes 14 and the wiring electrode (not shown) to each other. This enables a drive signal to be supplied from a control circuit (not shown) through the wiring electrode and the extraction electrodes 14 to the drive electrodes 13*b* formed on the side surfaces of the ejection grooves 5 and the dummy grooves 6.

A liquid jet head 1 is manufactured as described above, and thus the drive electrodes on both side surfaces of the respective dummy grooves 6 may be collectively electrically separated without the necessity of alignment with high precision. Therefore, channels with decreased pitch and smaller width may be accommodated. It is noted that in the embodiment described above, the dummy grooves 6 are formed so as to be deeper than the ejection grooves 5 and only the electrode material on the bottom surfaces of the dummy grooves 6 is removed, but the present invention is not limited thereto. Both the ejection grooves 5 and the dummy grooves 6 may be formed so as to be deep and both the electrode material on the bottom surfaces of the ejection grooves 5 and the electrode material on the bottom surfaces of the dummy grooves 6 may be removed. In this case, the electrode material deposited on both side surfaces of an ejection groove 5 (or drive electrodes 13) are electrically connected to each other by the extraction electrode 14*a* or the electrode material deposited on an arc-like and slanted bottom surface of the ejection groove 5.

Second Embodiment

Figure 6:
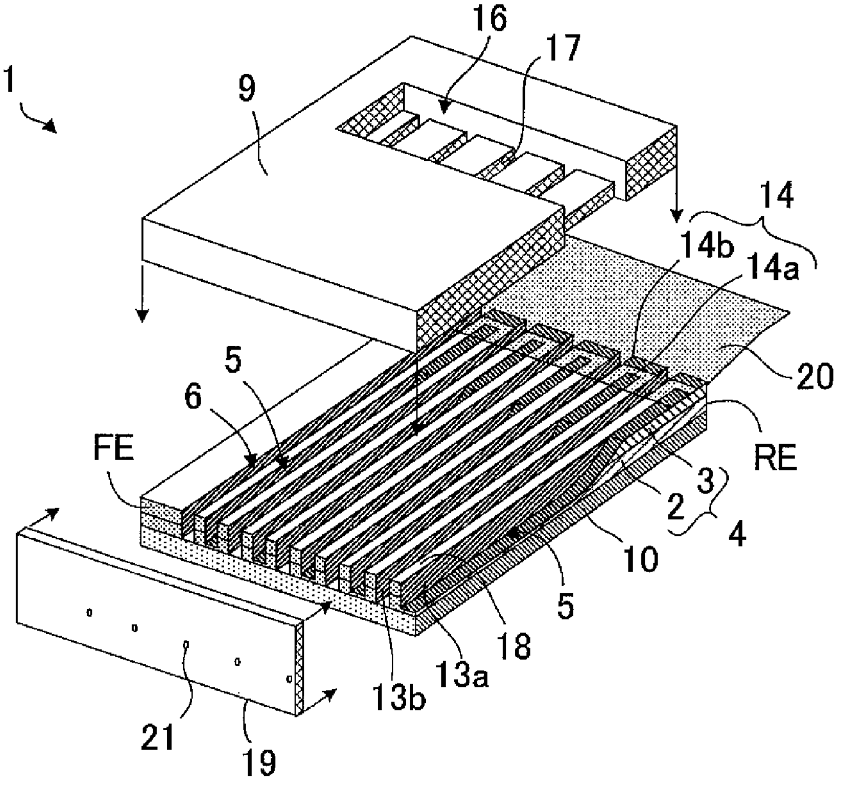
FIG. 6 is an explanatory diagram of a liquid jet head according to a second embodiment of the present invention.

FIG. 6 is an exploded perspective view of the liquid jet head 1 according to a second embodiment of the present invention, which is formed by the method of manufacturing the liquid jet head 1 according to the present invention. Like reference numerals are used to designate like members or members having like functions.

As illustrated in FIG. 6, the liquid jet head 1 includes the stacked substrate 4 having the first base substrate 2 and the piezoelectric substrate 3 bonded thereon, the second base substrate 10 bonded to a lower surface of the stacked substrate 4, the cover plate 9 bonded to the upper surface of the stacked substrate 4, the nozzle plate 19 bonded to the front end FE of the stacked substrate 4, and the flexible substrate 20 adhered to the upper surface in proximity to the rear end RE of the stacked substrate 4. The piezoelectric substrate 3 is bonded onto the first base substrate 2 with an adhesive. The ejection grooves 5 and the dummy grooves 6 which pierce the piezoelectric substrate 3 to reach the first base substrate 2 are alternately formed in the surface of the stacked substrate 4 in parallel with one another. The ejection grooves 5 are formed from the front end FE to points before the rear end RE of the stacked substrate 4. The dummy grooves 6 are formed straight from the front end FE to the rear end RE of the stacked substrate 4. A part of the first base substrate 2 remains under the bottom surfaces of the ejection grooves 5. The dummy grooves 6 are formed so as to be deeper than the ejection grooves 5.

The cover plate 9 is bonded to the upper surface of the stacked substrate 4 so as to cover the ejection grooves 5 and the dummy grooves 6. The cover plate 9 includes the liquid supply chamber 16 and the slits 17 which communicate with the liquid supply chamber 16 for supplying liquid to the ejection grooves 5, respectively. The drive electrodes 13*a* are formed on both side surfaces of an ejection groove 5 and are electrically connected to each other. The drive electrodes 13*b* formed on both side surfaces of a dummy groove 6 are electrically separated by removing a lower portion of the first base substrate 2. Bottom portions of the dummy grooves 6 which are opened by partly removing the first base substrate 2 are closed by the second base substrate 10.

The liquid jet head 1 further includes the nozzle plate 19 bonded to the end face of the front end FE of the stacked substrate 4, and the flexible substrate 20 bonded to the surface in proximity to the rear end RE of the stacked substrate 4. The nozzle plate 19 includes nozzles 21 which communicate with the ejection grooves 5, respectively. The flexible substrate 20 includes the wiring electrode (not shown) which is electrically connected to the extraction electrodes 14 formed on the surface in proximity to the rear end RE of the stacked substrate 4.

The liquid jet head 1 operates as follows. When liquid is supplied from a liquid tank to the liquid supply chamber 16, the respective ejection grooves 5 are filled with the liquid via the slits 17. The drive electrodes 13*a* formed on both side surfaces of the respective ejection grooves 5 are connected to GND via the extraction electrodes 14*a* and the wiring electrode which is formed on the flexible substrate 20. When drive signals supplied from the control circuit are given to the drive electrodes 13*b* formed on the side surfaces of the dummy grooves 6 via the wiring electrode formed on the flexible substrate 20 and the extraction electrodes 14*b*, the partition walls 18 deform, and the liquid filled in the ejection grooves 5 is ejected from the nozzles 21. This causes a record to be produced with the liquid on a recording medium.

This structure enables the liquid jet head 1 to remove the electrode material deposited on the bottom surfaces of the dummy grooves 6 without using a laser beam or a diamond cutter, and thus, decreased pitch and smaller width of the ejection channels and the dummy channels may be attained easily, and the liquid jet head 1 having nozzles which are arranged with high density may be provided. In particular, the present invention is suitable for a high density liquid jet head having a groove width of 20 μm to 50 μm. Note that, in the embodiment described above, as the first base substrate 2, the piezoelectric material of the piezoelectric substrate 3 may be used. In this case, the piezoelectric substrate 3 is polarized in the direction perpendicular to the surface thereof while the first base substrate 2 is polarized in the direction opposite to the direction of polarization of the piezoelectric substrate 3. This may form the liquid jet head 1 of a chevron type. Further, as the second base substrate 10, a low dielectric constant material having a dielectric constant that is lower than a dielectric constant of the piezoelectric material may be used. This may suppress capacitive coupling between adjacent partition walls 18 to reduce leakage of a drive signal. Further, the ejection grooves 5 may be formed so as to be as deep as the dummy grooves 6, and the second base substrate 10 may close the bottom portions of the ejection grooves 5 and the dummy grooves 6.

Third Embodiment

Figure 7:
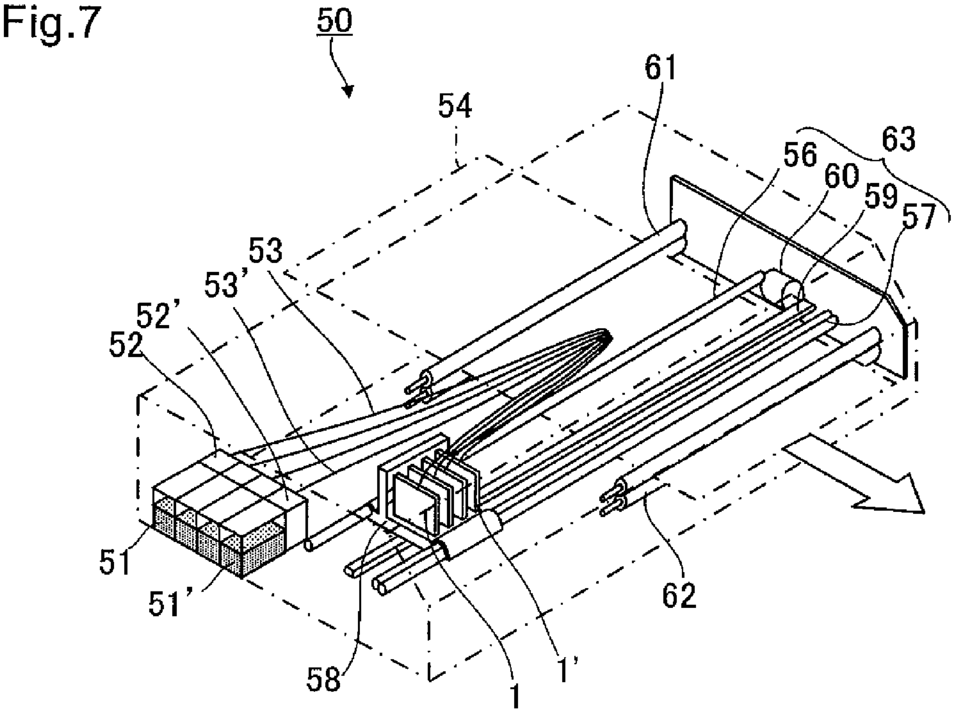
FIG. 7 is a schematic perspective view of a liquid jet apparatus according to a third embodiment of the present invention.
Figure 8:
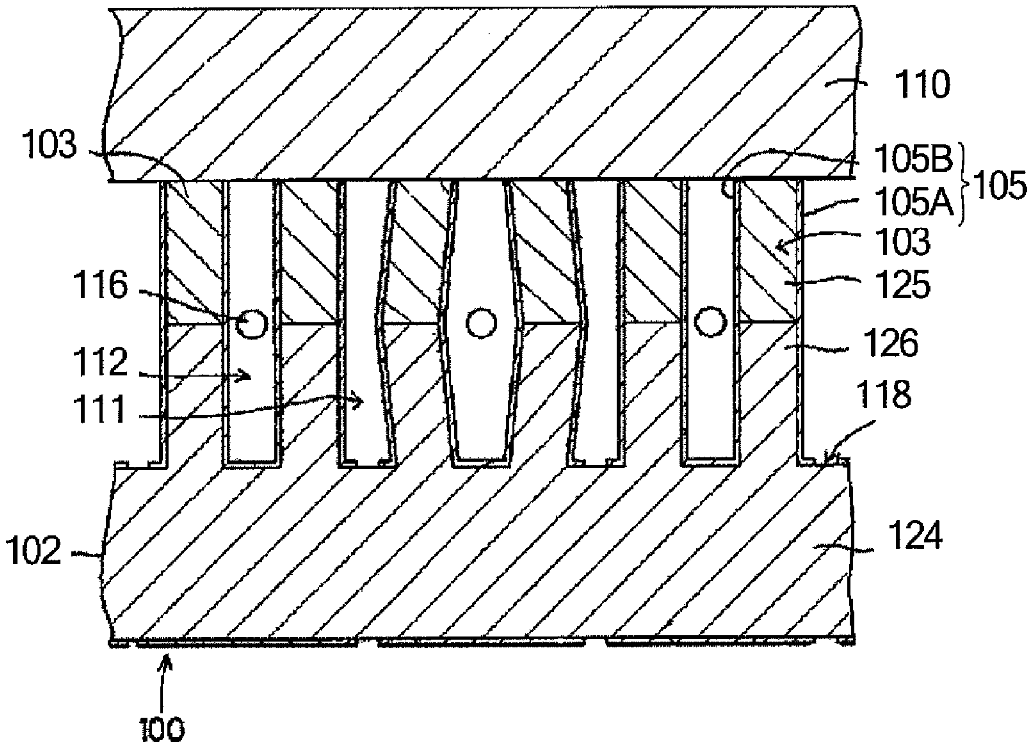
Fig.8 PRIOR ART
FIG. 8 illustrates a cross-sectional structure of a conventionally known liquid jet head.

FIG. 7 is a schematic perspective view of a liquid jet apparatus 50 according to a third embodiment of the present invention. The liquid jet apparatus 50 uses the liquid jet head 1 described above in the first or second embodiment. The liquid jet apparatus 50 includes a moving mechanism 63 for reciprocating liquid jet heads 1 and 1', liquid supply tubes 53 and 53' for supplying liquid to the liquid jet heads 1 and 1', respectively, and liquid tanks 51 and 51' for supplying the liquid to the liquid supply tubes 53 and 53', respectively. The liquid jet heads 1 and 1' each include an ejection channel for ejecting the liquid, a liquid supply chamber for supplying the liquid to the ejection channel, and a pressure damper (not shown) for supplying the liquid to the liquid supply chamber.

Specific description is given below. The liquid jet apparatus 50 includes a pair of transport means 61 and 62 for transporting a recording medium 54 such as paper in a main scanning direction, the liquid jet heads 1 and 1' for ejecting the liquid onto the recording medium 54, pumps 52 and 52' for pressing the liquid stored in the liquid tanks 51 and 51' to supply the liquid to the liquid supply tubes 53 and 53', respectively, and the moving mechanism 63 for moving the liquid jet heads 1 and 1' to perform scanning in a sub-scanning direction orthogonal to the main scanning direction.

The pair of transport means 61 and 62 each extend in the sub-scanning direction, and include a grid roller and a pinch roller that rotate with their roller surfaces coming into contact with each other. The grid roller and the pinch roller are rotated about their shafts by means of a motor (not shown) to transport the recording medium 54 sandwiched between the rollers in the main scanning direction. The moving mechanism 63 includes a pair of guide rails 56 and 57 extending in the sub-scanning direction, a carriage unit 58 capable of sliding along the pair of guide rails 56 and 57, an endless belt 59 to which the carriage unit 58 is connected for moving the carriage unit 58 in the sub-scanning direction, and a motor 60 for revolving the endless belt 59 through pulleys (not shown).

The carriage unit 58 has the plurality of liquid jet heads 1 and 1' placed thereon, and ejects liquid droplets of four types, for example, yellow, magenta, cyan, and black. The liquid tanks 51 and 51' store liquid of corresponding colors, and supply the liquid through the pumps 52 and 52' and the liquid supply tubes 53 and 53' to the liquid jet heads 1 and 1', respectively. A control portion of the liquid jet apparatus 50 sends a drive signal to the liquid jet heads 1 and 1' to cause the liquid jet heads 1 and 1' to eject the liquid droplets of the respective colors. The control portion controls the timing to eject the liquid from the liquid jet heads 1 and 1', the rotation of the motor 60 for driving the carriage unit 58, and the transport speed of the recording medium 54, to thereby record letters, diagrams, and an arbitrary pattern onto the recording medium 54.

What is claimed is:

1. A method of manufacturing a liquid jet head, comprising:
- a stacked substrate forming step of bonding a piezoelectric substrate onto a first base substrate to form a stacked substrate having a first end and a second end opposite the first end;
- a groove forming step of alternately forming ejection grooves for ejection channels and dummy grooves for dummy channels in parallel with one another, the ejection grooves and the dummy grooves having such a depth as to pierce the piezoelectric substrate and to reach the first base substrate, the dummy grooves being formed so as to be deeper than the ejection grooves, the depth of each of the dummy grooves being constant from the first end to the second end of the stacked substrate;
- an electrode material depositing step of depositing an electrode material on inner bottom and side surfaces of the ejection grooves and the dummy grooves;
- a cover plate bonding step of bonding a cover plate to the piezoelectric substrate so as to cover the ejection grooves and the dummy grooves;
- a first base substrate removing step of removing a part of the first base substrate on a side opposite to the cover plate to open the bottom surfaces of the dummy grooves, thereby collectively removing the electrode material deposited on the bottom surfaces of the dummy grooves to electrically separate the electrode material formed on opposite side surfaces of each of the dummy grooves from each other; and
- a second base substrate bonding step of bonding a second base substrate to the first base substrate.

2. A method of manufacturing a liquid jet head according to claim 1, wherein, in the groove forming step, at least one ends of the ejection grooves are formed to points which are inside an outer periphery of the piezoelectric substrate, and the dummy grooves are formed to the outer periphery of the piezoelectric substrate.

3. A method of manufacturing a liquid jet head according to claim 2, further comprising:
- after the stacked substrate forming step, a resin film pattern forming step of forming a pattern of a resin film on a surface of the piezoelectric substrate; and
- after the electrode material depositing step, a resin film peeling step of removing the resin film and forming drive electrodes on side surfaces of the ejection grooves and the dummy grooves and forming extraction electrodes on the surface of the piezoelectric substrate.

4. A method of manufacturing a liquid jet head according to claim 2, wherein:
- in the groove forming step, the dummy grooves are formed so as to be deeper than the ejection grooves; and
- in the first base substrate removing step, a part of the first base substrate is left under the ejection grooves.

5. A method of manufacturing a liquid jet head according to claim 2, wherein:
- the first base substrate comprises a piezoelectric material; and
- the second base substrate has a dielectric constant that is lower than a dielectric constant of the piezoelectric material.

6. A method of manufacturing a liquid jet head according to claim 1, further comprising:
- after the stacked substrate forming step, a resin film pattern forming step of forming a pattern of a resin film on a surface of the piezoelectric substrate; and
- after the electrode material depositing step, a resin film peeling step of removing the resin film and forming drive electrodes on side surfaces of the ejection grooves and the dummy grooves and forming extraction electrodes on the surface of the piezoelectric substrate.

7. A method of manufacturing a liquid jet head, comprising:
- a stacked substrate forming step of bonding a piezoelectric substrate onto a first base substrate to form a stacked substrate having a first end and a second end opposite the first end;
- a groove forming step of alternately forming ejection grooves for ejection channels and dummy grooves for dummy channels in parallel with one another, the ejection grooves and the dummy grooves having such a depth as to pierce the piezoelectric substrate and to reach the first base substrate, the dummy grooves being formed so as to be deeper than the ejection grooves, and the depth of each of the dummy grooves being constant from the first end to the second end of the stacked substrate;

an electrode material depositing step of depositing an electrode material on inner bottom and side surfaces of the ejection grooves and the dummy grooves;

a cover plate bonding step of bonding a cover plate to the piezoelectric substrate so as to cover the ejection grooves and the dummy grooves;

a first base substrate removing step of removing a part of the first base substrate on a side opposite to the cover plate so that a part of the first base substrate is left under the ejection grooves and so that bottom surfaces of the dummy grooves are opened to thereby collectively remove the electrode material deposited on the bottom surfaces of the dummy grooves; and a second base substrate bonding step of bonding a second base substrate to the first base substrate.

8. A method of manufacturing a liquid jet head according to claim 1, wherein:

the first base substrate comprises a piezoelectric material; and the second base substrate has a dielectric constant that is lower than a dielectric constant of the piezoelectric material.

9. A method of manufacturing a liquid jet head, comprising:

bonding a piezoelectric substrate onto a first base substrate;

forming in the piezoelectric substrate and the first base substrate a plurality of ejection grooves for ejection channels and a plurality of dummy grooves for dummy channels so that the ejection grooves and dummy grooves are alternately arranged in parallel relation to one another, the dummy grooves being formed so as to be deeper than the ejection grooves, the depth of each of the dummy grooves being constant from a first end to a second end of the first base substrate;

depositing an electrode material on side and bottom surfaces of each of the ejection grooves and dummy grooves;

bonding a cover plate to the piezoelectric substrate so as to cover the ejection grooves and the dummy grooves;

removing a part of the first base substrate on a side opposite to the cover plate to open the bottom surfaces of the dummy grooves, thereby collectively removing at least the electrode material deposited on the bottom surfaces of the dummy grooves; and bonding a second base substrate to the first base substrate.

10. A method according to claim 9, wherein the dummy grooves are formed so as to be deeper than the ejection grooves; and wherein the part of the first base substrate is removed so that a portion of the first base substrate remains under the ejection grooves.

11. A method according to claim 9, wherein the ejection and dummy grooves are formed with such a depth as to extend through the piezoelectric substrate and to extend into the first base substrate.

12. A method according to claim 9, wherein at least one end of each of the ejection grooves is formed to a position located inside an outer periphery of the piezoelectric substrate; and wherein the dummy grooves are formed to the outer periphery of the piezoelectric substrate.

13. A method according to claim 9, further comprising: forming a pattern of a resin film on a surface of the piezoelectric substrate after bonding of the piezoelectric substrate and before depositing of the electrode material; and removing the resin film and forming drive electrodes on the side surfaces of the ejection grooves and the dummy grooves and forming extraction electrodes on the surface of the piezoelectric substrate after depositing of the electrode material.

14. A method according to claim 13, wherein the part of the first base substrate is removed so that the drive electrodes formed on side surfaces of the dummy grooves are electrically separated from each other.

15. A method according to claim 9, wherein the first base substrate comprises a piezoelectric material; and wherein the second base substrate has a dielectric constant that is lower than a dielectric constant of the piezoelectric material.

* * * * *